United States Patent
Motiee et al.

(10) Patent No.: US 8,674,775 B2
(45) Date of Patent: Mar. 18, 2014

(54) OUT-OF-PLANE RESONATOR

(75) Inventors: Mehrnaz Motiee, San Francisco, CA (US); Emmanuel P. Quevy, El Cerrito, CA (US); David H. Bernstein, Berkeley, CA (US)

(73) Assignee: Silicon Laboratories Inc., Austin, TX (US)

( * ) Notice: Subject to any disclaimer, the term of this patent is extended or adjusted under 35 U.S.C. 154(b) by 16 days.

(21) Appl. No.: 13/173,449

(22) Filed: Jun. 30, 2011

(65) Prior Publication Data

US 2013/0002363 A1 Jan. 3, 2013

(51) Int. Cl.
*H03B 5/30* (2006.01)

(52) U.S. Cl.
USPC .............. 331/156; 331/107 R; 331/116 R; 331/154

(58) Field of Classification Search
USPC .......... 331/156, 107 R, 116 R, 154; 310/300, 310/309, 321, 370; 333/186, 197, 200
See application file for complete search history.

(56) References Cited

U.S. PATENT DOCUMENTS

| | | | |
|---|---|---|---|
| 6,073,484 | A | 6/2000 | Miller et al. |
| 6,497,141 | B1 | 12/2002 | Turner et al. |
| 6,625,004 | B1 * | 9/2003 | Musolf et al. ............ 361/278 |
| 6,710,680 | B2 | 3/2004 | Niu et al. |
| 7,514,760 | B1 | 4/2009 | Quevy |
| 7,514,853 | B1 | 4/2009 | Howe et al. |
| 7,591,201 | B1 | 9/2009 | Bernstein et al. |
| 7,639,104 | B1 | 12/2009 | Quevy et al. |
| 2010/0013360 | A1 * | 1/2010 | Baborowski et al. ...... 310/370 |
| 2010/0314969 | A1 * | 12/2010 | Gaidarzhy et al. ......... 310/321 |

OTHER PUBLICATIONS

U.S. Appl. No. 13/075,800, filed Mar. 30, 2011, entitled "Technique for Forming a MEMS Device," naming Emmanuel P. Quevy et al., as inventors.
U.S. Appl. No. 13/075,806, filed Mar. 30, 2011, entitled "Technique for Forming a MEMS Device Using Island Structures," naming Emmanuel P. Quevy et al., as inventors.
U.S. Appl. No. 12/182,082, filed Jul. 29, 2008, entitled "Out-of-Plane MEMS Resonator with Static Out-of-Plane Deflection," naming Emmanuel P. Quevy et al., as inventors.
Chiou, J. C. et al., "Out-of-plane CMOS-MEMS Resonator with Electrostatic Driving and Piezoresistive Sensing," Sixth IEEE Conference on Nanotechnology, IEEE-NANO 2006, Jun. 17-20, 2006, pp. 929-932.

* cited by examiner

*Primary Examiner* — Joseph Chang
*Assistant Examiner* — Jeffrey Shin
(74) *Attorney, Agent, or Firm* — Abel Law Group, LLP (57) ABSTRACT

A microelectromechanical system (MEMS) device includes a resonator anchored to a substrate. The resonator includes a first strain gradient statically deflecting a released portion of the resonator in an out-of-plane direction with respect to the substrate. The resonator includes a first electrode anchored to the substrate. The first electrode includes a second strain gradient of a released portion of the first electrode. The first electrode is configured to electrostatically drive the resonator in a first mode that varies a relative amount of displacement between the resonator and the first electrode. The resonator may include a resonator anchor anchored to the substrate. The first electrode may include an electrode anchor anchored to the substrate in close proximity to the resonator anchor. The electrode anchor may be positioned relative to the resonator anchor to substantially decouple dynamic displacements of the resonator relative to the electrode from changes to the substrate.

30 Claims, 9 Drawing Sheets

OUT-OF-PLANE RESONATOR

BACKGROUND

1. Field of the Invention

The invention is related to microelectromechanical systems (MEMS) and more particularly to manufacturing MEMS structures.

2. Description of the Related Art

In general, microelectromechanical systems (MEMS) are very small mechanical devices. Typical MEMS devices include sensors and actuators, which may be used in various applications, e.g., accelerometers, gyroscopes, and pressure sensors. The mechanical device is typically capable of some form of mechanical motion and is formed at the micro-scale using fabrication techniques similar to those utilized in the microelectronic industry, such as thin film deposition and thin film patterning by photolithography and reactive ion etching (RIE).

Figure 1:
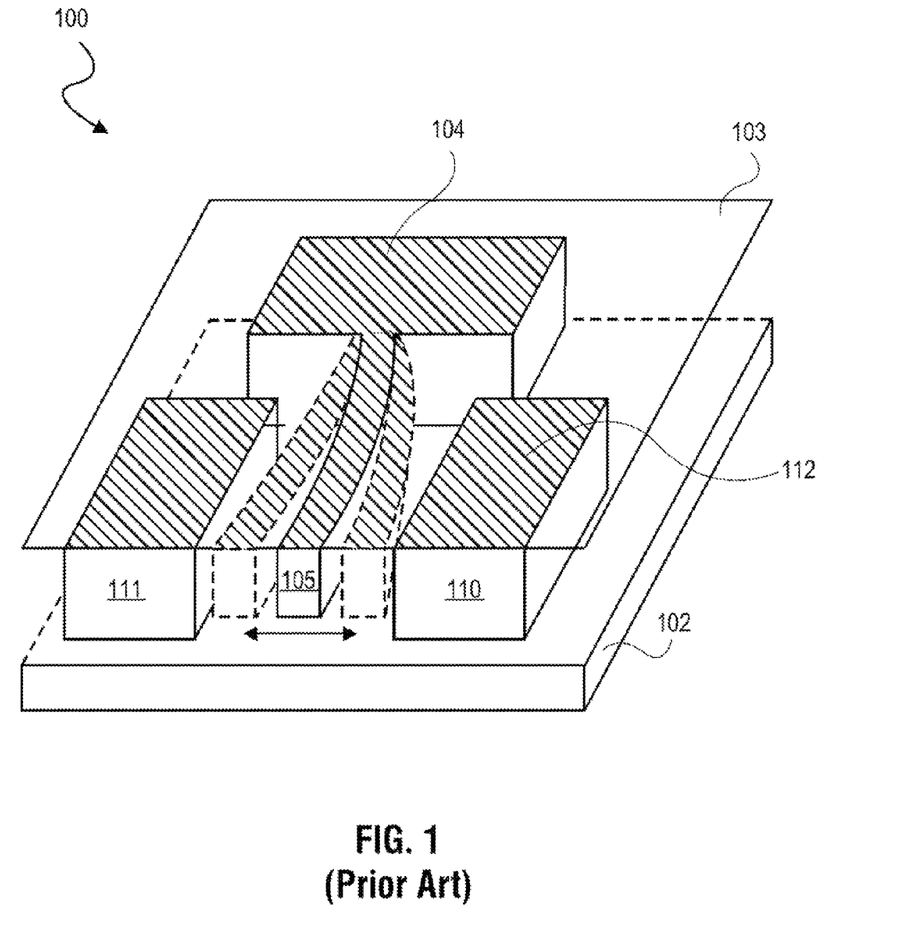
FIG. 1 illustrates a MEMS device including an in-plane resonator.

Certain MEMS devices include a resonator, which may be used in timing devices of an integrated circuit (IC). The resonator may have a variety of physical shapes, e.g., beams and plates. Referring to FIG. 1, a conventional MEMS device (e.g., MEMS device 100) includes a resonator (e.g., resonator 105) coupled to a substrate (e.g., substrate 102) via an anchor (e.g., anchor 104). During operation, a first electrode (e.g., electrode 110) electrostatically drives resonator 105 to dynamically deflect, which increases a capacitance of resonator 105 when a voltage differential exists between resonator 105 and electrode 110 by decreasing the gap between resonator 105 and electrode 110. Because electrode 110 and resonator 105 are the same height and in the same plane, resonator 105, when driven, deforms laterally across a distance between electrode 110 and a second electrode 111, remaining in plane 103 of the electrode 110. Plane 103 is substantially parallel to substrate 102. An electrode (e.g., electrode 111) detects the resonant frequency of resonator 105 as the capacitance varies between the two in response to the deflection driven by electrode 110. Because resonator 105 is driven to resonate in a mode where the resonator 105 remains in plane 103 of the electrode 110, the conventional MEMS device 100 is commonly referred to as an "in-plane" or "lateral" mode resonator.

There are several drawbacks to the parallel-plate-capacitor drive and sense mechanism of conventional MEMS device 100. The electrostatic force of MEMS device 110 is nonlinear unless the amplitude of vibration is limited to a small fraction of the capacitor gap. In addition, since the transduction efficiency of resonator 105 is dependent on the area of the parallel-plate capacitor formed between the resonator 105 and electrode 110, fabrication of the resonator 105 generally includes a number of techniques to ensure the resonator 105, when released, remains perfectly flat and in the plane of the electrode 110. Such fabrication techniques are often thermally taxing or require prohibitively expensive or commercially unfeasible methods.

SUMMARY

In at least one embodiment of the invention, a microelectromechanical system (MEMS) device includes a resonator anchored to a substrate. The resonator includes a first strain gradient statically deflecting a released portion of the resonator in an out-of-plane direction with respect to the substrate. The resonator includes a first electrode anchored to the substrate. The first electrode includes a second strain gradient of a released portion of the first electrode. The first electrode is configured to electrostatically drive the resonator in a first mode that varies a relative amount of displacement between the resonator and the first electrode. In at least one embodiment of the MEMS device, the resonator includes a resonator anchor anchored to the substrate. In at least one embodiment of the MEMS device, the first electrode includes an electrode anchor anchored to the substrate in close proximity to the resonator anchor. In at least one embodiment of the MEMS device, the electrode anchor is positioned relative to the resonator anchor to substantially decouple dynamic displacements of the resonator relative to the electrode from changes to the substrate. In at least one embodiment of the MEMS device, the resonator anchor is substantially centered within a perimeter of the released portion of the resonator. In at least one embodiment of the MEMS device, the first electrode includes an electrode anchor anchored to the substrate. In at least one embodiment of the MEMS device, the electrode anchor is substantially centered within the resonator.

In at least one embodiment of the invention, a method of operating a microelectromechanical system (MEMS) device includes driving a released portion of a first electrode to cause a first released end of a resonator to resonate in a direction out-of-plane with respect to a substrate to which the resonator is anchored. The driving causes a second released end of the resonator to resonate in the direction out-of-plane with respect to the substrate. The first and second released ends of the resonator resonate out-of-phase with each other. In at least one embodiment, the method includes detecting an indication of the resonance of the first released end of the resonator using a second electrode. In at least one embodiment of the method, the dynamic displacements of the first and second electrodes relative to dynamic displacements of the resonator are substantially decoupled from displacements of the substrate.

In at least one embodiment of the invention, a method of manufacturing an integrated circuit including a microelectromechanical system (MEMS) device includes forming a structural layer on a substrate. The method of manufacturing an integrated circuit including a MEMS device includes releasing the structural layer to form a resonator anchored to the substrate and a first electrode anchored to the substrate, the resonator having a first strain gradient statically deflecting a released portion of the resonator, the first electrode having a released portion having a second strain gradient. In at least one embodiment of the method of manufacturing an integrated circuit including a MEMS device, the resonator anchor is anchored to the substrate and the first electrode is anchored to the substrate in close proximity to the resonator anchor. In at least one embodiment of the method of manufacturing an integrated circuit including a MEMS device, dynamic displacements of the first and second electrodes relative to dynamic displacements of the resonator are substantially decoupled from displacements of the substrate. In at least one embodiment of the method of manufacturing an integrated circuit including a MEMS device, anchors of the first electrode and second electrode are substantially centered within a released portion of the resonator, the released portion of the resonator substantially surrounding the first electrode and second electrode.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED
EMBODIMENT(S)

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention.

As referred to herein, the terms "over," "under," "between," and "on" refer to a relative position of one member with respect to other members. For example, one member disposed over or under another member may be directly in contact with the other member or may have one or more intervening members. Moreover, one member disposed between members may be directly in contact with the two members or may have one or more intervening members. In contrast, a first member "on" a second member is in contact with that second member. Additionally, the relative position of one member with respect to other members is provided assuming operations are performed relative to a substrate without consideration of the absolute orientation of the substrate. Furthermore, a "top surface" refers to a surface of a structure or layer which is opposite of or distant from the substrate surface, while "bottom surface" refers to a surface proximate to the substrate surface. References to a "sidewall" therefore refer to surfaces nominally perpendicular to the substrate surface (e.g., vertical when the major surface of the substrate is in a typical horizontal orientation).

In at least one embodiment of the present invention, a resonator is statically deflected, or deformed, "out-of-plane." As used herein, "out-of-plane" deformation means the deformation is in a direction perpendicular to the largest linear dimensions of the substrate (i.e., the surface of the substrate). For example, where the largest linear dimensions are in directions across a substrate surface, out-of-plane is in the vertical direction, e.g., away from the substrate. The out-of-plane deflection is referred to herein as "static" because it is a result of a residual stress gradient in the structural layer from which the resonator is formed. The residual film stress gradient in the structural layer induces a strain gradient, or deflection, along the length L when the resonator is at rest.

In particular embodiments, use of the strain gradient enables out-of-plane transduction without yield and reliability problems due to stiction (e.g., the sticking of the resonator to the substrate) when the resonator is driven to dynamically deflect out-of-plane. Because a residual stress gradient in the structural layer is embraced rather than eschewed in such designs, processing steps directed at reducing or eliminating the residual stress gradient of the resonator become unnecessary. In particular embodiments, out-of-plane transduction is utilized to achieve better transduction efficiency per unit area as compared to lateral resonator designs of similar linear dimensions (i.e., footprint) results in a lower motional resistance. Sensitivity to critical dimensions of the resonator may be reduced relative to lateral resonator designs and embodiments of the resonator include film thicknesses adjusted to tailor the frequency of the out-of-plane mode.

Figure 2:
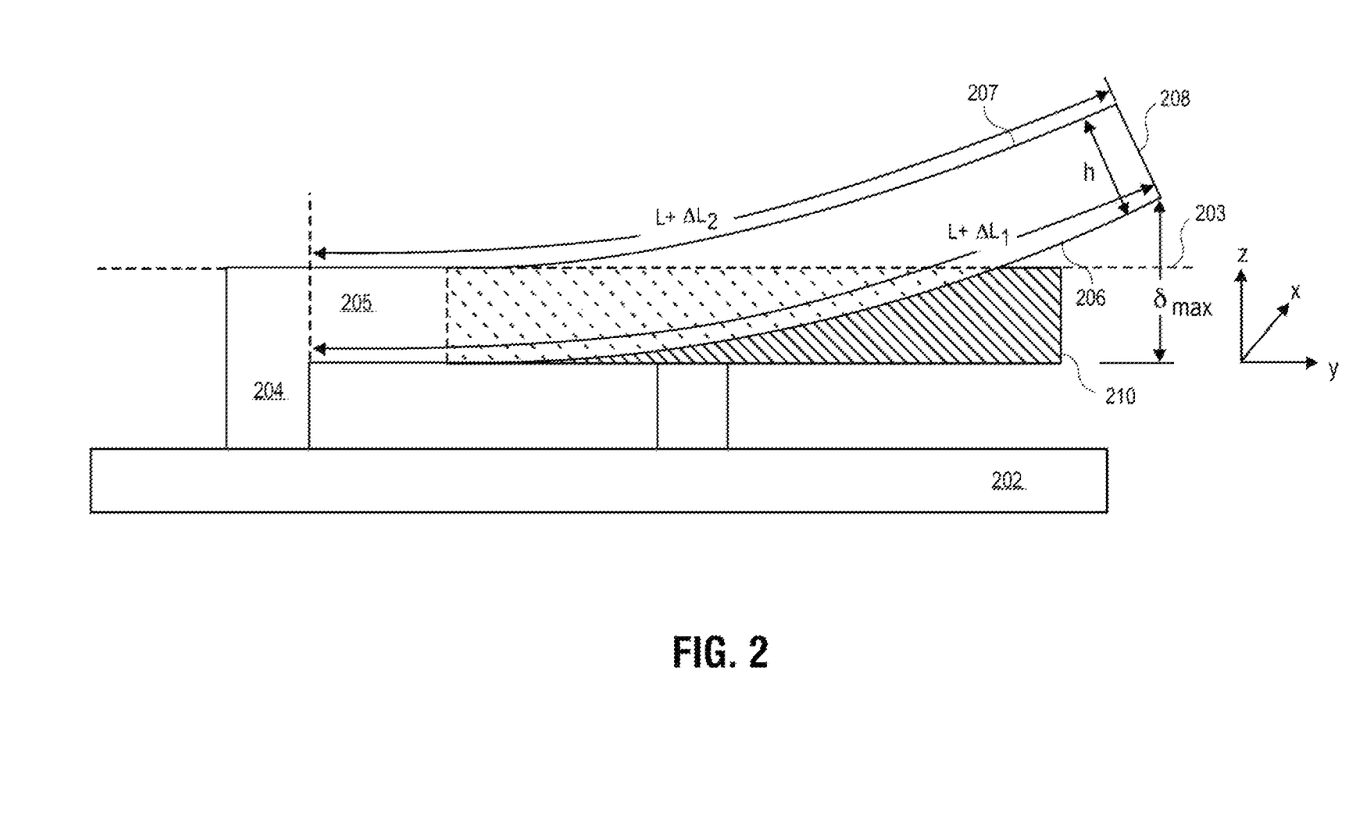
FIG. 2 illustrates a side view of a resonator statically deflected out-of-plane.

Referring to FIG. 2, a side view of an exemplary resonator (e.g., resonator 205) illustrates a strain gradient so as to be statically deflected out of an electrode plane 203 passing through a portion of an electrode (e.g., top surface of electrode 210). In at least one embodiment, resonator 205 is driven and sensed electrostatically by an adjacent pair of electrodes 210. However, other embodiments do not utilize electrostatic transduction, but instead rely on other transduction means to sustain the resonator's out-of-plane motion. For example, a resonator statically defected out-of-plane may rely on thermal, piezoelectric, piezoresistive or optical transduction and may include a transducer embedded in the resonator itself. While such transduction methods are known in the art and therefore are not discussed further herein, it should be appreciated that references herein to a plane of an electrode in electrostatic driver embodiments is alternately described for alternate transducers in terms of a plane extending along a major length of the resonator (i.e., largest dimension of the resonator) and substantially parallel to an underlying substrate surface from which the resonator statically deflects "out-of" (e.g., "above" or "below").

In at least one embodiment of the MEMS device of FIG. 2, resonator 205 is a cantilevered beam coupled to a substrate 202 by an anchor 204. The anchoring of electrode 210 is such that it remains fixed in-plane after the resonator is released and is not substantially deflected by a residual stress gradient that may be present in the electrode material. As referred to herein, a "release" of a structure or a portion of a structural layer frees that structure or portion of the structural layer to have a "released portion" that is free to mechanically move or be deflected in at least one directional plane with respect to the substrate. In the depicted embodiment, electrode 210 is approximately the same thickness or height as the resonator 205.

In at least one embodiment of the MEMS device of FIG. 2, electrode plane 203 is substantially parallel with a plane of the major surface of substrate 202 and therefore the out-of-plane deflection of resonator 205 results in a first portion, proximate to a cantilever tip 208, being elevated away from the plane of substrate 202 by a maximum static deflection z while a second portion, proximate to anchor 204, remains within the electrode plane 203. Similarly, because the resonator 205 is deflected out of electrode plane 203, the deflection causes the resonator 205 to move in a direction "away" from the electrode 210. In the depicted embodiment, the resonator 205 has a strain gradient across a thickness h such that bottom resonator surface 206, proximate to substrate 202, is deformed by a first greater amount to a length $L+\Delta L_1$ and the top resonator surface 207, distant from substrate 202, is deformed by a second lesser amount to a length $L+\Delta L_2$, where L is the nominal length of the cantilever beam "as fabricated." In an alternate embodiment, the out-of-plane static deflection is in a direction toward the plane of substrate 202 (e.g., "downward," rather than the "upward" direction in FIG. 2).

The amount of maximum static deflection $\delta_{max}$ may be any non-zero amount. Preferably, the amount of maximum static deflection $\delta_{max}$ is at least 50% of the thickness h and in certain embodiments, the amount of maximum static deflection $\delta_{max}$ is equal to or greater than the thickness h of the resonator. For example, resonator 205 has a rectangular cross section with width w and thickness h with a Young's modulus of E. The residual film stress is a tensor which has nonzero components in the lateral directions only, that is $\sigma_{xx}=\sigma_{yy}=\sigma_0$ and the remaining components vanish. In an embodiment where the gradient of $\sigma_0$ in the z direction is $\Gamma$ and the residual stress at the bottom surface 206 (located at z=0) is −200 MPa, $\sigma_0$ (x, y, z)=−200−zΓ where $\sigma_0$ is in MPa. For an embodiment where Γ=50 MPa/μ and h is 2 μm, there is an average residual stress of −150 MPa. Although the stress distribution in other embodiments differs from the exemplary linear embodiment, it will be qualitatively similar. Under these conditions the upward deflection along the beam will be $$\delta(x) = \frac{\Gamma}{2E}x^2, \quad (1)$$

where x is measured from the anchor 204, as depicted in FIG. 2. Thus, for an embodiment where L=100μ and E=140 GPa, the static tip deflection, $\delta(L)\cong 1.8\mu$. Hence, the maximum deflection $\delta_{max}$ is approximately two microns, or about the same as the thickness h of the resonator 205. In an alternate embodiment, a resonator has a strain gradient across a thickness such that a bottom resonator surface, proximate to a substrate, is deformed by a lesser amount than a top resonator surface, distant from a substrate to be statically deflected out-of-plane in a direction toward the substrate.

In an embodiment, a resonator statically deflected out-of-plane is driven to resonate in an out-of-plane mode. Thus, during operation, the amount of out-of-plane deflection is varied from the maximum static deflection z depicted in FIG. 2. In certain embodiments, the magnitude of maximum dynamic displacement (e.g., at cantilever tip 208) is less than the magnitude of maximum static deflection or displacement z. Because the static deflection due to the residual stress may lift the cantilever tip 208 completely out of the plane of the electrode 210, this portion of the electrode becomes ineffective in driving the resonator in an in-plane mode. However, the out-of-plane modes of particular embodiments described elsewhere herein are driven efficiently because of the static out-of-plane deflection. Additional embodiments of out-of-plane resonators are described in U.S. patent application Ser. No. 12/182,082, filed Jul. 29, 2008, entitled "Out-of-Plane MEMS Resonator with Static Out-of-Plane Deflection," naming Emmanuel P. Quevy et al. as inventors, which application is incorporated herein by reference. Note that, as described above, anchor 204 anchors resonator 208 to substrate 202 and electrode 210 is anchored to substrate 202 so that it remains fixed in-plane after the resonator is released. Accordingly, under some operating conditions, changes to substrate 202 (e.g., volume changes resulting from thermal and/or packaging stresses that expand or contract substrate 202) change the relative distance between electrode 210 and resonator 208 and vary the dynamic displacements of resonator 208 relative to electrode 210, thereby changing the resonant frequency of the device of FIG. 2.

Figure 3A:
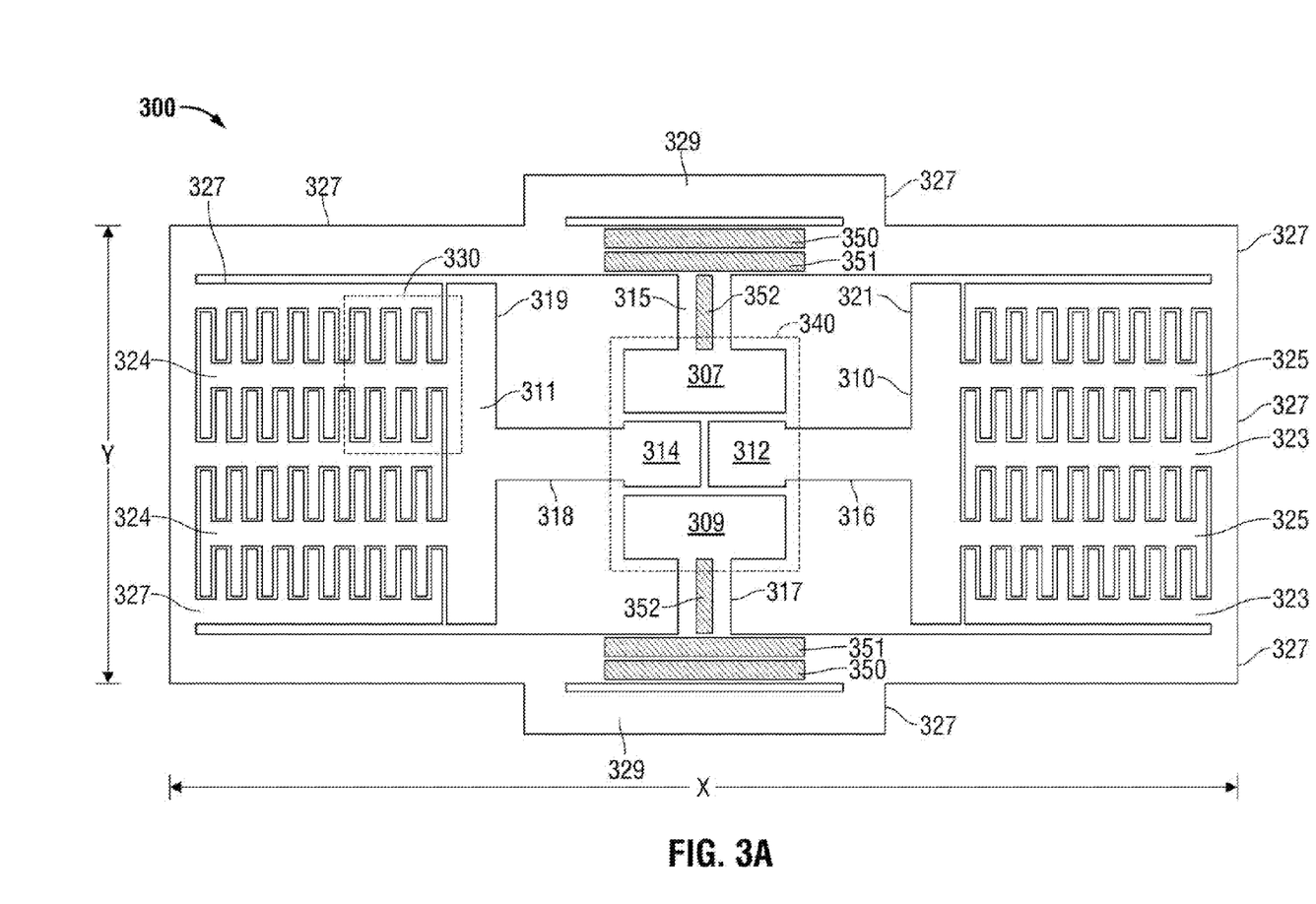
FIG. 3A illustrates a plan view of an out-of-plane resonator at rest, consistent with at least one embodiment of the invention.

Referring to FIG. 3A, in at least one embodiment of an out-of-plane resonator (e.g., MEMS resonator device 300), dynamic displacements of a resonator relative to a drive electrode and a sense electrode are substantially decoupled from changes to a substrate to which the electrodes and resonator are anchored, thereby reducing or eliminating changes in a resonant frequency of MEMS resonator device 300 in response to stresses on the substrate. In at least one embodiment of MEMS resonator device 300, resonator 327 and electrodes 310 and 311 both include released portions that are anchored to a substrate in substantially the same location. Since locating the electrode anchors and resonator anchors in the same location on the substrate is not typically feasible, in at least one embodiment of MEMS resonator device 300, the electrode and resonator anchors are located in closest possible proximity (e.g., as close as allowable by the design rules for the target manufacturing process).

In at least one embodiment of MEMS resonator device 300, resonator 327 includes anchor portions (e.g., resonator anchors 307 and 309) and released portions (e.g., the body of resonator 327). In at least one embodiment of MEMS resonator device 300, electrode 310 and electrode 311 each include an anchor portion (e.g., anchor 312 and anchor 314, respectively) and released portions, e.g., a beam portion (e.g., beam 316 and beam 318, respectively), an arm portion (e.g., arm 321 and arm 319, respectively), and at least one electrostatic comb portion (e.g., electrostatic comb portions 325 and electrostatic comb portions 324, respectively). In at least one embodiment of MEMS resonator device 300, resonator anchors 307 and 309 and electrode anchors 312 and 314 are located in close proximity to each other (e.g., close enough to reduce or eliminate changes in a resonant frequency of MEMS resonator device 300 in response to stresses on the substrate). In at least one embodiment of MEMS resonator device 300, resonator anchors 307 and 309 and electrode anchors 312 and 314 are located in a region (e.g., region 340) that is substantially centered within the resonator body. In at least one embodiment of MEMS resonator device 300, resonator anchors 307 and 309 and electrode anchors 312 and 314 are surrounded by released portions of resonator 327. In at least one embodiment of MEMS resonator device 300, the length (L) of resonator 327 is approximately 220 μm, the width (W) of resonator 327 is approximately 80 μm, arm 321 is approximately 30 μm long (i.e., approximately 30 μm between the right edge of anchor 312 to the left edge of arm 321), beam 316 is approximately 30 μm long, comb portions 325 are 80 μm long, 5 μm wide, and has fingers that are approximately 2 μm wide and approximately 7 μm long.

Figure 3B:
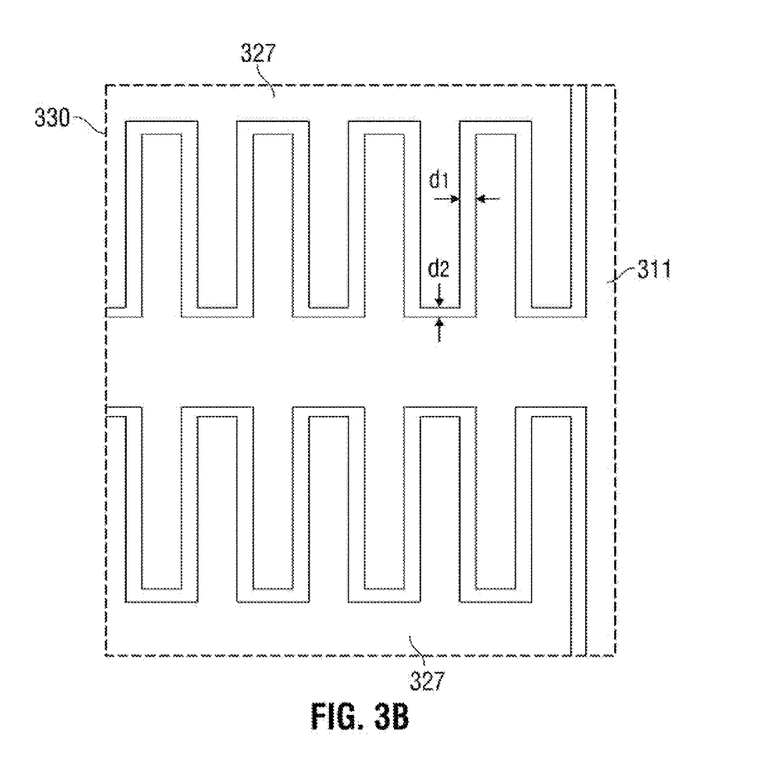
FIG. 3B illustrates a detailed portion of the out-of-plane resonator of FIG. 3A consistent with at least one embodiment of the invention.

In at least one embodiment of MEMS resonator device 300, each of electrodes 310 and 311 includes two electrostatic comb portions 325 and 324, respectively. Each of those electrostatic comb portions includes multiple electrode fingers (e.g., eight fingers, as illustrated in FIG. 3A, 16 fingers, or any suitable number of fingers) extending in a direction (e.g., the y-direction) to increase a surface area of a capacitive comb. Those electrode fingers are interdigitated with resonator fingers of an electrostatic comb portion of resonator 327. In operation, the interdigitated resonator fingers move vertically with respect to the substrate (i.e., out-of-plane), and the resonator fingers move vertically, toward or away from the electrode fingers, thereby changing the capacitance between the resonator and electrodes. Referring to FIG. 3B, comb teeth of resonator 327 are interdigitated with teeth of electrode 311 on two sides of electrode 311. Gaps between resonator 327 and electrode 311 in two dimensions of the perimeter area of the electrode (e.g., gaps $d_1$ and $d_2$) remain approximately constant in resonant modes of MEMS resonator device 300 since net in-plane electrostatic forces along the length of resonator 327 are insignificant. In at least one embodiment of MEMS resonator device 300, gaps $d_1$ and $d_2$ are approximately 0.5 μm to 1.5 μm.

Although the interdigitation of resonator and electrode fingers increases the surface area of the capacitively coupled portions of resonator 327 and electrodes 310 and 311, other geometries resulting in different surface areas for the capacitively-coupled portions of resonator 327 may be used. The number of fingers and geometries of the fingers varies based on specifications for a particular resonator application. Structures described herein may be formed by any suitable MEMS manufacturing technique. Techniques for forming MEMS resonator device 300 are described in U.S. Pat. No. 7,514,760, filed Mar. 9, 2007, entitled "IC-Compatible MEMS Structure," naming Emmanuel P. Quevy as inventor; U.S. patent application Ser. No. 13/075,800, filed Mar. 30, 2011, entitled "Technique for Forming a MEMS Device," naming Emmanuel P. Quevy et al., as inventors; and U.S. patent application Ser. No. 13/075,806, filed Mar. 30, 2011, entitled "Technique for Forming a MEMS Device Using Island Structures," naming Emmanuel P. Quevy et al., as inventors, which applications are incorporated herein by reference.

Referring back to FIG. 3A, in at least one embodiment, MEMS resonator device 300 includes temperature compensation structures that reduce or substantially eliminate the dependence of a frequency of resonation on temperature. For example, resonator 327 includes structures (e.g., filled trenches 350, 351, and 352) that are formed from a material (e.g., silicon dioxide, or other dielectric material) having a different Young's modulus dependence on temperature than another material of resonator 327 (e.g., silicon germanium alloy). In at least one embodiment of MEMS resonator device 300, filled trenches 350 and 351 are approximately 20 μm long and 3 μm wide, and filled trenches 352 are approximately 10 μm long and 2 μm wide. In at least one embodiment of MEMS resonator device 300, those temperature compensation structures are consistent with the techniques described in U.S. Pat. No. 7,639,104, filed Mar. 9, 2007, entitled "Method for Temperature Compensation in MEMS Resonators with Isolated Regions of Distinct Material," naming Emmanuel P. Quevy and David H. Bernstein as inventors; U.S. Pat. No. 7,591,201, filed Mar. 9, 2007, entitled "MEMS Structure Having a Compensated Resonating Member," naming David H. Bernstein, Roger T. Howe, and Emmanuel P. Quevy as inventors; and U.S. Pat. No. 7,514,853, filed May 10, 2007, entitled "MEMS Structure Having a Stress Inverter Temperature-Compensated Resonating Member," naming Roger T. Howe, Emmanuel P. Quevy, and David H. Bernstein as inventors, which applications are hereby incorporated by reference.

Figure 4:
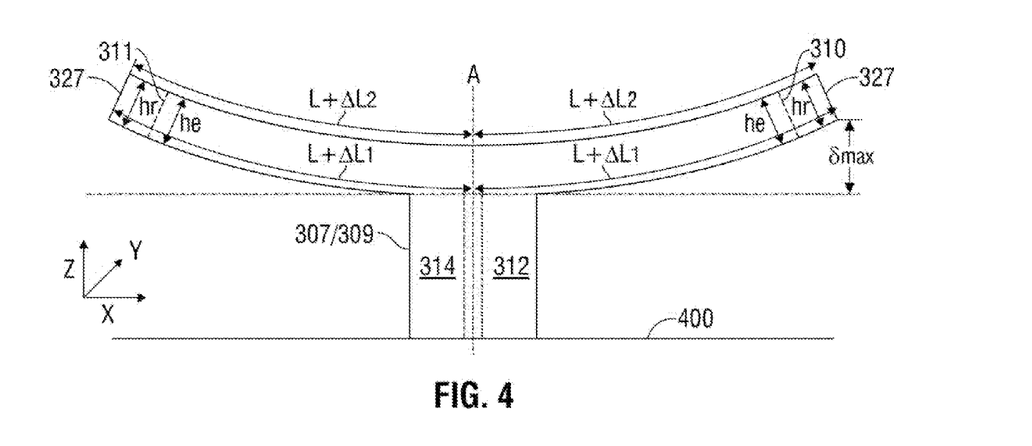
FIG. 4 illustrates a side view of the out-of-plane resonator of FIG. 3A, consistent with at least one embodiment of the invention.

Referring to FIG. 4, in at least one embodiment of MEMS resonator device 300, out-of-plane deflection of resonator 327, electrode 310, and electrode 311 results in end portions of resonator 327 (e.g., portions distant from anchors 307 and 309) and end portions of electrodes 310 and 311 (e.g., portions distant from anchors 312 and 314, respectively) being elevated away from the plane of substrate 400 by a static displacement z, while portions, proximate to anchors 307, 309, 314 and 312, remain within the plane of the anchor surfaces. In at least one embodiment of MEMS resonator device 300, electrodes 310 and 311 have the same thickness or height as resonator 327 (i.e., $h_e$ is approximately equal to $h_r$, e.g., $h_e \approx h_r = h \approx 2$ μm). In at least one embodiment of MEMS resonator device 300, resonator 327 has a strain gradient across a thickness $h_r$ such that the bottom surface of resonator 327, proximate to substrate 400, is deformed by a first greater amount to a length $L+\Delta L_1$ and the top surface of resonator 327, distant from substrate 400, is deformed by a second, lesser amount to a length $L+\Delta L_2$, where L is the nominal length of resonator 327 extending in a first direction from an approximate line of symmetry of resonator 327, which is approximately the same as the nominal length of resonator 327 extending in a second direction opposite the first direction, from the approximate line of symmetry of resonator 327. For example, axis A divides resonator 327 into two approximately congruent portions, each portion substantially surrounding one of electrodes 310 and 311. In at least one alternate embodiment of MEMS resonator device 300, the out-of-plane deflection is in a direction toward the plane of substrate 400 (e.g., downward, rather than the upward direction of FIG. 4). The amount of static displacement may be any non-zero amount and may be any amount consistent with the description above with regard to FIG. 2. In at least one embodiment of MEMS resonator device 300, the static displacement is approximately ½ h. In at least one embodiment of MEMS resonator device 300, a maximum static displacement is approximately h.

Figure 5:
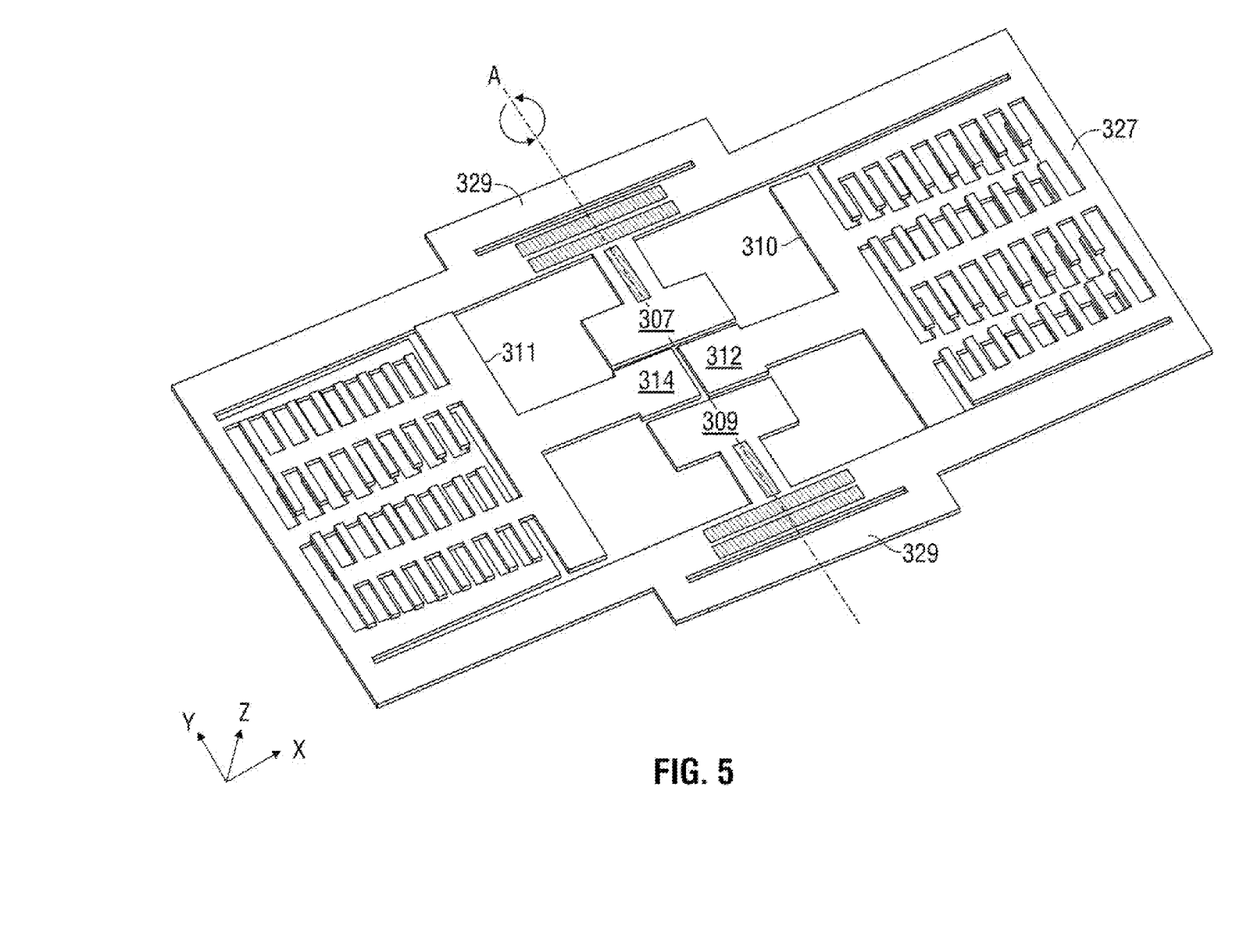
FIG. 5 illustrates a perspective view of the out-of-plane resonator of FIG. 3A driven in a first mode, consistent with at least one embodiment of the invention.
Figure 7:
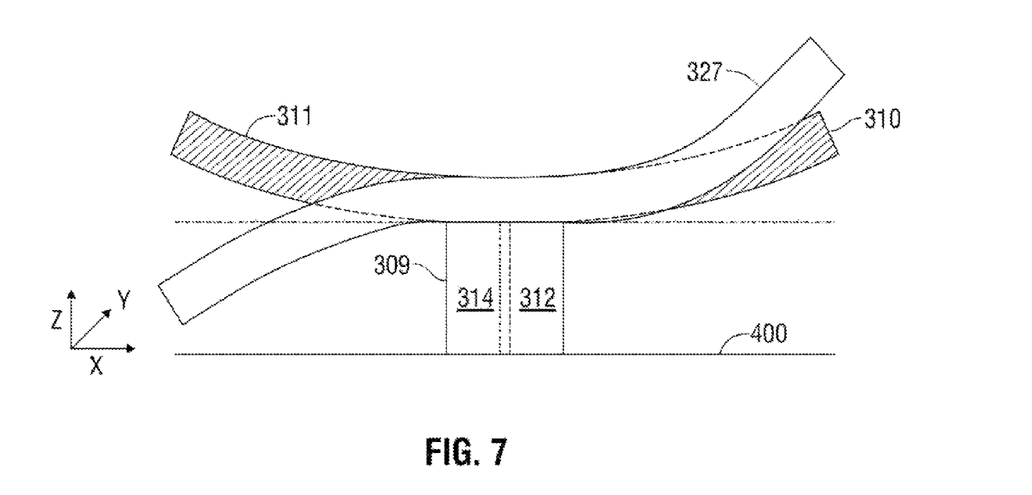
FIG. 7 illustrates a side view of the out-of-plane resonator of FIG. 3A driven in a first mode, consistent with at least one embodiment of the invention.

Referring to FIGS. 5 and 7, in at least one embodiment of MEMS resonator device 300, bias voltages are applied to resonator 327 and electrodes 310 and 311. Since the bias voltages are different potentials for the resonator and electrodes, an electromotive force (e.g., 1-3V) exists between electrodes 310 and 311 and resonator 327. Application of an AC input signal as an input to electrode 310 changes the electromotive force and dynamically deflects the released portions of resonator 327 from a static position. In at least one embodiment of MEMS resonator device 300, in a first mode of operation, one end of resonator 327 moves toward the substrate and one end moves away from the substrate in a "teeter-totter" motion, and pushes the resonator into resonance at a particular frequency (e.g., 70 kiloHertz (kHz)). Opposite ends of the resonator are displaced with respect to the substrate in directions out-of-phase with each other, e.g., in a counterclockwise direction around axis A, while electrodes 310 and 311 have no significant dynamic displacement (i.e., electrodes 310 and 311 stay substantially still). In at least one embodiment of MEMS resonator device 300, when resonating in this teeter-totter mode, each end of resonator 327 moves approximately 50 nm to approximately 100 nm from its static state.

Figure 6:
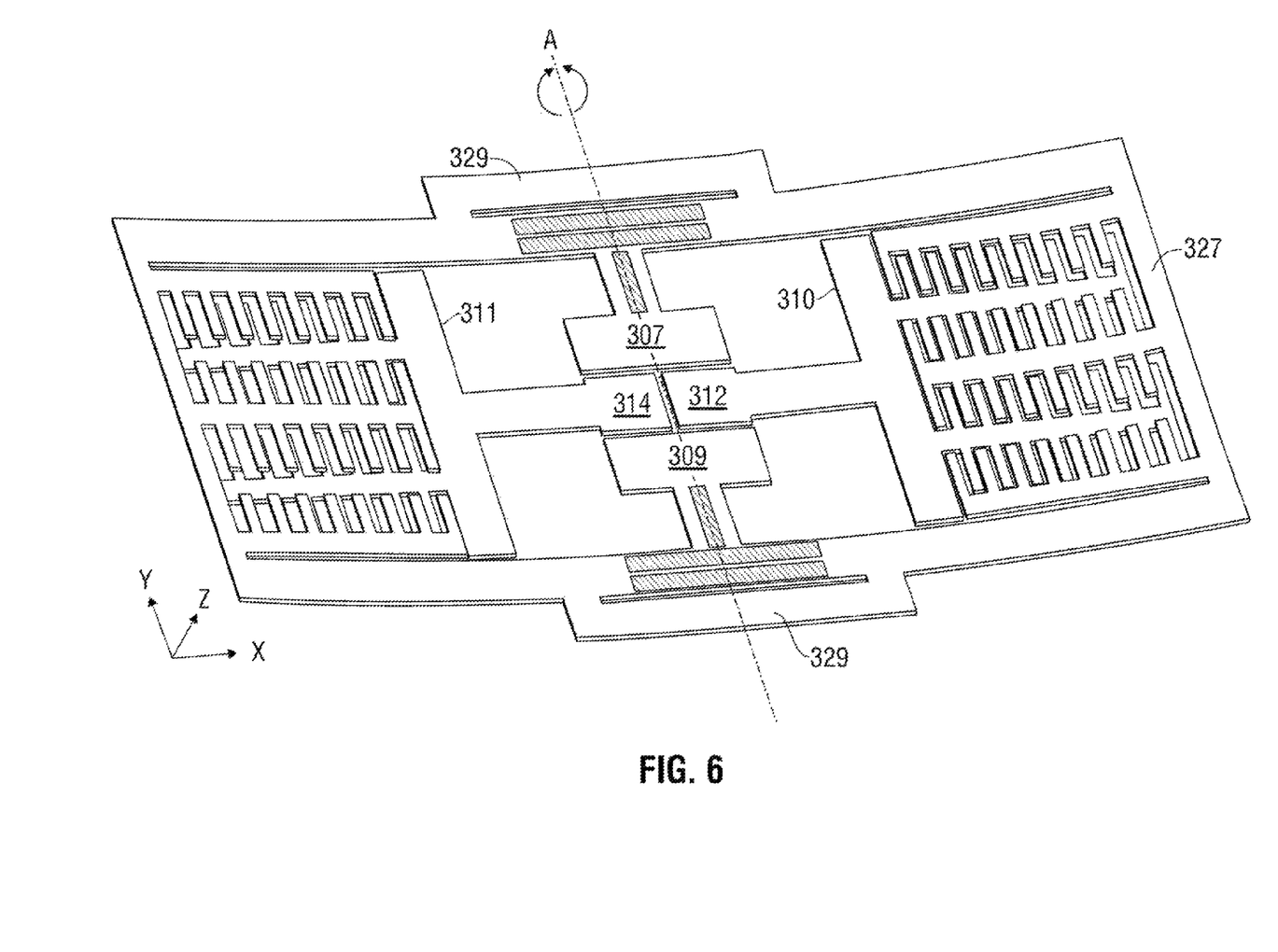
FIG. 6 illustrates a perspective view of the out-of-plane resonator of FIG. 3A driven in a second mode, consistent with at least one embodiment of the invention.
Figure 8:
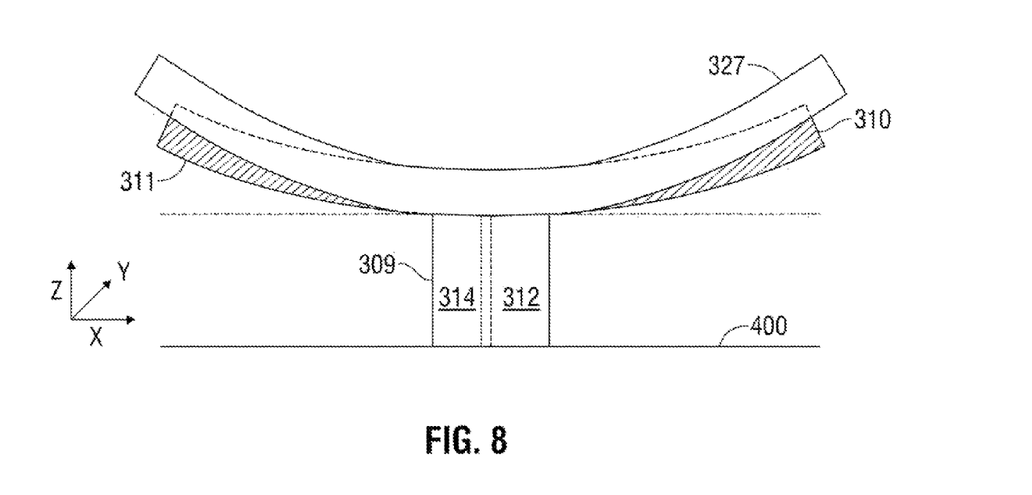
FIG. 8 illustrates a side view of the out-of-plane resonator of FIG. 3A driven in a second mode, consistent with at least one embodiment of the invention.

Referring to FIGS. 6 and 8, in at least one embodiment of MEMS resonator device 300, application of an AC input signal as an input to electrode 310 causes MEMS resonator device 300 to enter a second mode of operation where both ends of resonator 327 on either side of axis A move in phase with respect to the substrate (i.e., both ends move toward the substrate or both ends move away from the substrate, simultaneously, in a "flapping" motion) and resonate at a particular frequency (e.g., 106.5 kHz). Note that in at least one application of MEMS resonator device 300, this flapping mode is undesirable. Accordingly, in at least one embodiment of MEMS resonator device 300, structures (e.g., structures 329) are included to suppress this mode of operation. For example, structures 329 increase the stiffness of resonator 327 and increase the frequency of the second mode of operation. In at least one embodiment of MEMS resonator device 300, structures 329 have a length that is approximately ⅓ of the length of resonator 327. In at least one embodiment of MEMS resonator device 300, structures 329 are formed from the same materials as the remainder of resonator 327 (e.g., silicon germanium alloy).

In at least one embodiment of MEMS resonator device 300, application of an AC input signal as an input to electrode 310 causes MEMS resonator device 300 to enter a third mode of operation, where both the resonator and the electrodes move out-of-plane with respect to the substrate and resonate at a third resonant frequency (e.g., 160.2 kHz). In at least one application of MEMS resonator device 300, this third mode is undesirable and the design of MEMS resonator device 300 includes features intended to suppress this third mode. For example, a natural frequency of the electrodes is based on dimensions of the beams 316 and 318 and arms 319 and 321. Decreasing the length of beams 316 and 318 increases the resonant frequency of the electrode in the third mode of operation.

In at least one embodiment of MEMS resonator device 300, the resonant frequency of MEMS resonator device 300 in the first, second and third modes, (e.g., 70 kHz, 106.5 kHz, and 160.2 kHz, respectively) are exemplary only and in other embodiments, MEMS resonator device 300 is designed to resonate in those three modes at different corresponding frequencies. The resonant frequency of each mode depends on various design parameters, e.g., length and width of resonator 327, length and width of resonator beams 315 and 317, and/or other design parameters.

In at least one embodiment of MEMS resonator device 300, the electrodes and resonator portions of MEMS resonator device 300 are formed from the same material (e.g., 2 µm of a silicon germanium alloy) and upon release from the substrate, the electrodes and resonator portions curl up approximately the same amount (i.e., have the same amount of out-of-plane static displacement as measured as a function of distance from the center of MEMS resonator device 300. A zero difference in curling results in no transduction, i.e., the electrodes do not provide a driving force to the resonator. In at least one embodiment of MEMS resonator device 300, the left tip displacement difference is approximately 0.4 µm. In at least one embodiment of MEMS resonator device 300, a non-negligible difference in static displacement difference is introduced by including oxide portions in electrodes 310 and 311. The oxide is an amorphous film with a stress gradient substantially less than the stress gradient of the silicon germanium alloy, e.g., approximately no stress gradient. A released structure formed from only the oxide would be perfectly flat. Accordingly, the amount of curling (i.e., static displacement) of an electrode structure is inversely dependent on the amount of oxide in the electrode beams (e.g., increases in oxide in the electrodes decreases the amount of curling).

Figure 9:
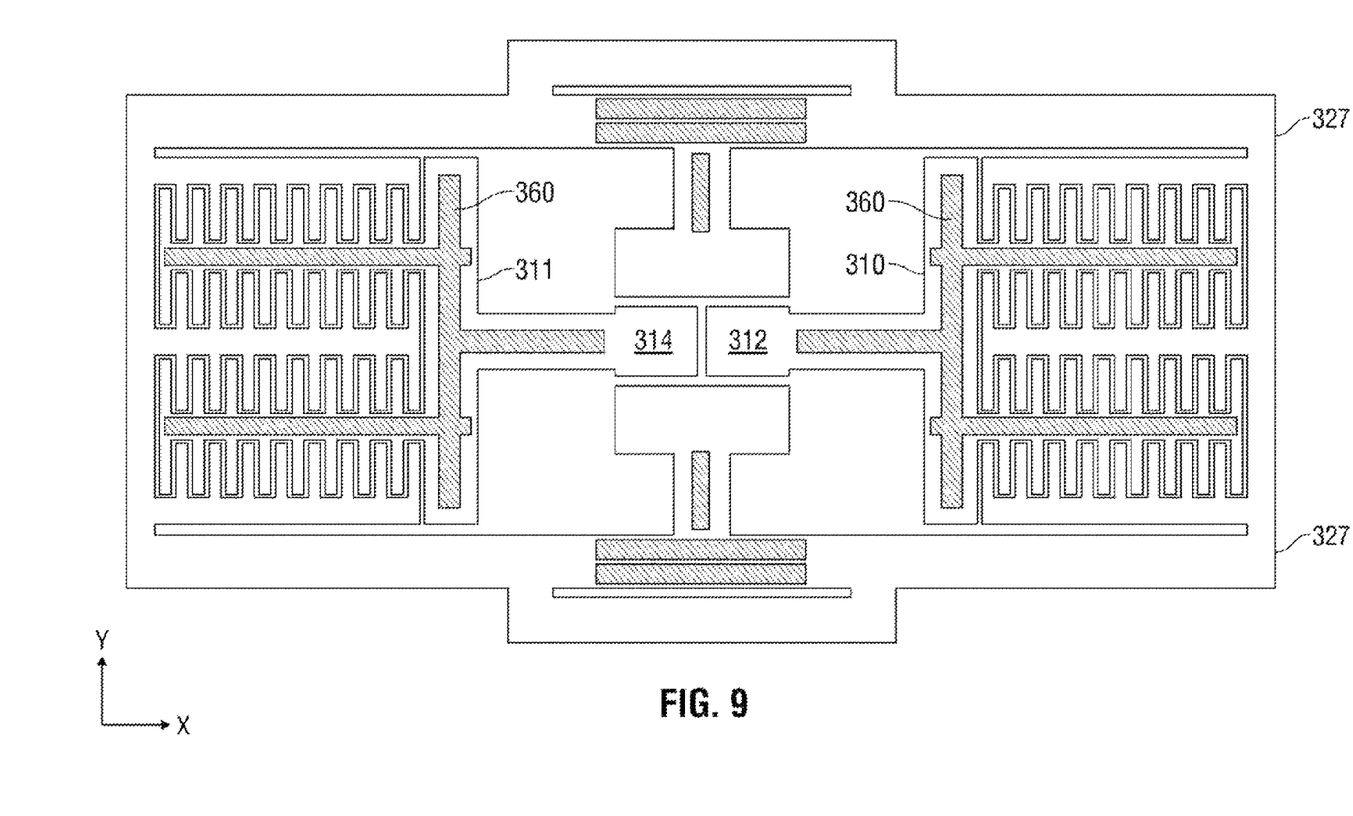
FIG. 9 illustrates a plan view of an out-of-plane resonator including oxide electrode portions consistent with at least one embodiment of the invention.
Figure 10:
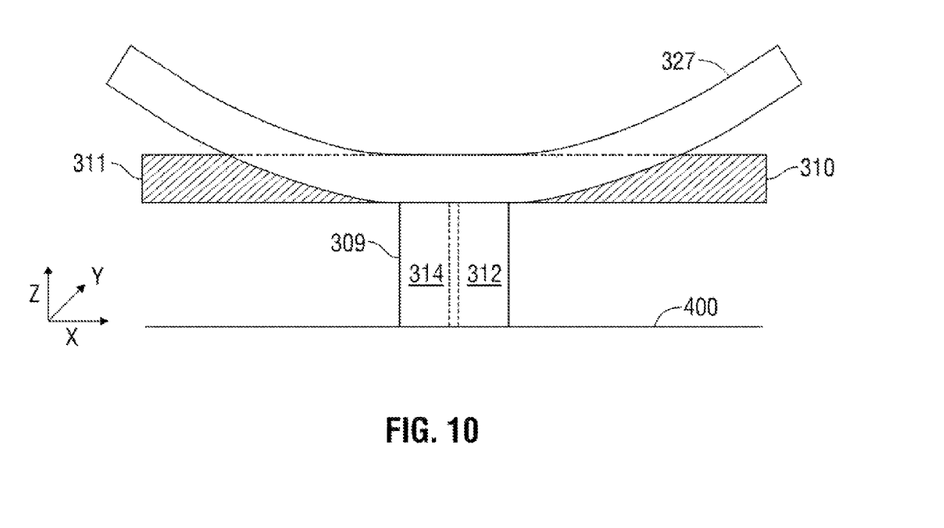
FIG. 10 illustrates a side view of the out-of-plane resonator of FIG. 9 at rest, consistent with at least one embodiment of the invention.
Figure 11:
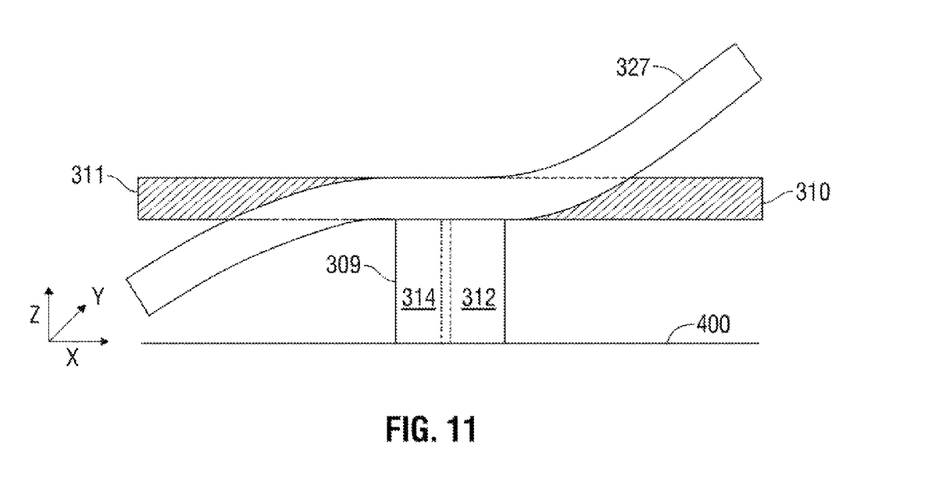
FIG. 11 illustrates a side view of the out-of-plane resonator of FIG. 9 driven in a first mode, consistent with at least one embodiment of the invention.

Referring to FIGS. 9, 10 and 11, in at least one embodiment of MEMS resonator device 300, the out-of-plane static deflection of electrodes 310 and 311 is adjusted using slits or trenches formed in the electrodes filled with a material having no substantial stress gradient or residual stress gradient (e.g., silicon dioxide). The effect of those filled trenches (e.g., filled trenches 360) is to flatten the electrodes, thereby reducing or eliminating the static deflection of the released portions of the electrodes and increasing the difference between the static displacement of the resonator relative to the released portions of the electrodes (FIG. 10). FIG. 11 illustrates the first mode of operation for an embodiment of MEMS resonator device 300 including those filled trenches. Referring back to FIG. 3A, in at least one embodiment of MEMS resonator device 300, the left tip difference in static displacement of the resonator with respect to the released portion of the electrode is approximately 0.4 µm, whereas in an embodiment including filled trenches in the electrode (FIG. 9), the left tip difference in static displacement of the resonator with respect to the released portion of the electrode is approximately 0.8 µm.

Thus, various embodiments are described for an out-of-plane resonator that has a resonant frequency substantially isolated from effects of stresses (e.g., thermal and packaging stresses) on a substrate on which the out-of-plane resonator is formed. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test, or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., HDL, Verilog, Graphic Data System II (GDSII) data) of such circuits, systems, and methods, all as described herein, and as defined in the appended claims. In addition, the computer readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which the resonator has a rectangular shape and particular dimensions, one of skill in the art will appreciate that the teachings herein can be utilized with resonators and electrodes having other geometries and dimensions. Variations and modifications of the embodiments disclosed herein, may be made based on the description set forth herein, without departing from the scope and spirit of the invention as set forth in the following claims.

What is claimed is:

1. A microelectromechanical system (MEMS) device comprising:
a resonator anchored to a substrate, the resonator having a first strain gradient statically deflecting a released portion of the resonator in an out-of-plane direction with respect to the substrate; and
a first electrode anchored to the substrate, the first electrode having a second strain gradient of a released portion of the first electrode, wherein the first electrode is configured to electrostatically drive the resonator in a first mode that varies a relative amount of displacement between the resonator and the first electrode.

2. The MEMS device, as recited in claim 1, wherein the resonator comprises a resonator anchor anchored to the substrate and the first electrode comprises an electrode anchor anchored to the substrate in close proximity to the resonator anchor.

3. The MEMS device, as recited in claim 1, wherein the resonator comprises a resonator anchor anchored to the substrate and the first electrode comprises an electrode anchor anchored to the substrate, the electrode anchor being positioned relative to the resonator anchor to substantially decouple dynamic displacements of the resonator relative to the electrode from changes to the substrate.

4. The MEMS device, as recited in claim 1, wherein the first electrode comprises:
an electrode anchor anchored to the substrate, the electrode anchor being substantially centered within the resonator.

5. The MEMS device, as recited in claim 1, wherein the resonator comprises:
a resonator anchor anchored to the substrate, the resonator anchor being substantially centered within a perimeter of the released portion of the resonator.

6. The MEMS device, as recited in claim 1, wherein the released portion of the resonator substantially surrounds the electrode.

7. The MEMS device, as recited in claim 1,
wherein the released portion of the resonator and the released portion of the first electrode are free to mechanically move in an out-of-plane direction with respect to the substrate.

8. The MEMS device, as recited in claim 7,
wherein dynamic displacements of the released portion of the first electrode relative to dynamic displacements of the released portion of the resonator are substantially decoupled from displacements of the substrate.

9. The MEMS device, as recited in claim 1, further comprising:
a second electrode anchored to the substrate, the second electrode having a third strain gradient statically deflecting a released portion of the second electrode, wherein the second electrode is configured to electrostatically sense the relative amount of displacement between the resonator and the first electrode.

10. The MEMS device, as recited in claim 9, wherein the second electrode comprises:
an electrode anchor anchored to the substrate, the electrode anchor being in close proximity to the resonator anchor.

11. The MEMS device, as recited in claim 1, wherein the released portion of the first electrode comprises a first material having a first stress gradient and a second material having a second stress gradient substantially less than the first stress gradient.

12. The MEMS device, as recited in claim 1, wherein the resonator comprises:
a first portion formed from a first material having a first Young's modulus; and
a second portion formed from a second material having a second Young's modulus that reduces a dependence of a resonant frequency of the resonator on temperature of the resonator.

13. The MEMS device, as recited in claim 1, wherein a first portion of the electrode is interdigitated with a first portion of the resonator.

14. The MEMS device, as recited in claim 1, wherein the MEMS device is configured to operate in a resonant mode that dynamically deflects a first end of the resonator in a direction with respect to the substrate, opposite to a direction with respect to the substrate of dynamic deflection of a second end of the resonator device.

15. A method of operating a microelectromechanical system (MEMS) device comprising:
driving a released portion of a first electrode to cause a first released end of a resonator to resonate in a direction out-of-plane with respect to a substrate to which the resonator is anchored and to cause a second released end of the resonator to resonate in the direction out-of-plane with respect to the substrate, the first and second released ends of the resonator resonating out-of-phase with each other.

16. The method, as recited in claim 15, further comprising:
detecting an indication of the resonance of the first released end of the resonator using a released portion of a second electrode.

17. The method, as recited in claim 15, wherein dynamic displacements of the released portion of the first electrode and a released portion of a second electrode relative to dynamic displacements of the first and second released ends of the resonator are substantially decoupled from displacements of the substrate.

18. The method, as recited in claim 15, wherein an anchor of the first electrode and an anchor of a second electrode are in close proximity to an anchor of the resonator.

19. The method, as recited in claim 15, wherein an anchor of the first electrode and an anchor of a second electrode are substantially centered within a released portion of the resonator, the released portion of the resonator substantially surrounding the first electrode and second electrode.

20. The method, as recited in claim 15, wherein the stiffness of the first electrode is greater than the stiffness of the resonator.

21. The method, as recited in claim 15, wherein the driving varies an out-of-plane distance between interdigitated fingers of the first electrode and the resonator.

22. An apparatus comprising:
means for resonating; and
means for driving a first released end of the means for resonating to resonate in a direction out-of-plane with respect to a substrate to which the means for resonating is anchored and driving a second released end of the means for resonating out-of-phase with the first released end of the means for resonating, in the direction out-of-plane with respect to the substrate, dynamic displacements of a released portion of the means for driving relative to dynamic displacements of the first released end of the means for resonating being substantially decoupled from displacements of the substrate.

23. The apparatus, as recited in claim 22, wherein the means for driving comprises a means for anchoring to the substrate the means for driving in close proximity to a means for anchoring to the substrate the means for resonating.

24. The apparatus, as recited in claim 22, wherein the means for driving further comprises:
a means for sensing an indication of the resonation of the means for resonating.

25. A method of manufacturing an integrated circuit including a microelectromechanical system (MEMS) device comprising:
forming a structural layer on a substrate; and
releasing the structural layer to form a resonator anchored to the substrate and a first electrode anchored to the substrate, the resonator having a first strain gradient statically deflecting a released portion of the resonator in an out-of-plane direction with respect to the substrate, the first electrode having a released portion having a second strain gradient.

26. The method, as recited in claim 25, wherein the released portion of the resonator substantially surrounds the electrode.

27. The method, as recited in claim 25, wherein the first electrode comprises an electrode anchor to the substrate, the electrode anchor being substantially centered within the resonator.

28. The method, as recited in claim 25, wherein releasing the structural layer forms a second electrode anchored to the substrate.

29. The method, as recited in claim 25, wherein the resonator comprises:
   a resonator anchor anchored to the substrate, wherein the resonator anchor is substantially centered within a perimeter of the released portion of the resonator.

30. The method, as recited in claim 25, wherein the resonator comprises
   a resonator anchor anchored to the substrate and wherein the first electrode is anchored to the substrate in close proximity to the resonator anchor.

* * * * *